United States Patent
Huynh et al.

Patent Number: 5,221,783
Date of Patent: Jun. 22, 1993

[54] LOW DIELECTRIC CONSTANT POLYURETHANE FILLETING COMPOSITION

[75] Inventors: Mel V. Huynh, West Hills; Ludmila H. Kram, Pacific Palisades, both of Calif.

[73] Assignee: Hughes Aircraft Company, Los Angeles, Calif.

[21] Appl. No.: 344,645

[22] Filed: Apr. 28, 1989

[51] Int. Cl.$^5$ .......................... G08J 5/10; C08K 3/02; C08K 3/38; C08K 5/55; C08L 75/04

[52] U.S. Cl. .................... 524/701; 524/404; 524/590; 524/789; 524/791; 524/871; 524/873; 528/85

[58] Field of Search ............... 524/701, 789, 791, 873, 524/871, 404, 590; 528/85

[56] References Cited

U.S. PATENT DOCUMENTS

| | | | |
|---|---|---|---|
| 3,700,597 | 10/1972 | Kastenbein et al. | 524/404 |
| 4,075,151 | 2/1978 | Olstowski | 528/85 |
| 4,738,999 | 4/1988 | Blenner et al. | 524/590 |
| 4,791,187 | 12/1988 | Süling et al. | 528/85 |

FOREIGN PATENT DOCUMENTS

| | | | |
|---|---|---|---|
| 0145202 | 8/1984 | Japan | 524/404 |

*Primary Examiner*—Paul R. Michl
*Assistant Examiner*—U. K. Rajguru
*Attorney, Agent, or Firm*—M. E. Lachman; M. W. Sales; W. K. Denson-Low

[57] ABSTRACT

A polyurethane filleting composition which has production of electronic assemblies. The filleting composition is a self-curing polyurethane mixture which has a low dielectric constant, good thermal conductivity, and relatively long working life. The composition is a four part mixture containing:

(a) a diisocyanate having the formula

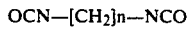

where n=1 to 6;

(b) a polyol having the formula

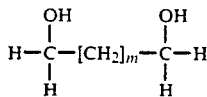

where m=1 to 10;

(c) a filler/curing promoter additive; and
(d) a viscosity control additive.

9 Claims, No Drawings

LOW DIELECTRIC CONSTANT POLYURETHANE FILLETING COMPOSITION

This invention was made with U.S. Government support under Contract No. N00019-84-C-0219 awarded by the Department of the Navy. The U.S. Government has certain rights in this invention.

1 Field of the Invention

The present invention relates generally to polyurethane adhesives and/or sealants which are used as filleting compositions. More particularly, the present invention relates to a polyurethane filleting composition having a low dielectric constant and other characteristics which make it well suited for use as a sealant and/or adhesive.

2. Description of Related Art

Many different adhesives and/or sealants have been developed for use in connection with electronic assemblies. In one particular assembly step, the adhesive is injected by a syringe or other means along the edge of a component to secure it in place. This operation is referred to as "filleting" and the adhesives so used are referred to as "filleting compositions." The latter must have a low dielectric constant, good usable work low dielectric constant filleting compositions. Currently, low dielectric constant polyurethanes are composed of long chain, high molecular weight polyols with hydroxyl group termination. These long chain polyurethane compounds require catalysts for curing. However, the use of catalysts reduces the usable work life of the frozen premixed polyurethane to times which are unacceptable for use in a mass production environment. The relatively short work life of these catalyst-cured polyurethane compositions results in frequent production line stoppage.

There presently is a need to provide polyurethane based filleting compositions which have characteristics which are better suited for the mass production environment. Such polyurethane compositions should be available as a premix which can be stored in a frozen state over relatively long periods of time and which can be extruded at room ambient temperature through conventional syringes typically used in applying polymer based filleting compositions. In addition, the filleting material should have a relatively long usable work life to reduce the number of production line stoppages. Further, the filleting material should have a low dielectric constant, (i.e., below 4.0 at 1.0 kHz) as well as good thermal characteristics, high thixotropy and a relatively short cure time.

SUMMARY OF THE INVENTION

In accordance with the present invention, a polyurethane filleting material is disclosed which offers many advantages including a low dielectric constant, good usable work life, good thermal characteristic, high thixotropy, good extrudability, and convenient packaging as a frozen premix.

The filleting material of the present invention is based on a composition which includes:

(a) 9 to 11 weight percent of a diisocyanate having the formula

OCN—[CH$_2$]n—NCO where n = 1 to 6;

(b) 38 to 42 weight percent of a polyol having the formula

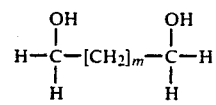

where m = 1 to 10;

(c) 45 to 53 weight percent of a filler/curing promoter additive; and (d) 0.25 to 1 weight percent of a viscosity control additive.

Filleting materials having the above composition have been found to have a dielectric constant of less than 4.0 at 1 kHz when cured. The compositions can be conveniently packaged as a frozen premix and, upon thawing, provide a workable filleting material which is easily extrudable through conventional syringes over a relatively long usable work life The composition is cured by heating to thereby avoid the problems associated with catalyst-cured polyurethane resins As a feature of the present invention, the filler/curing promoter additive is boron nitride. The boron nitride, in the amounts used in the present filleting composition, lowers the dielectric constant to levels below those required for use in electronic assemblies while at the same time increasing thermal conductivity. Increased thermal conductivity of the filleting material is also a desirable characteristic. In addition, the boron nitride functions as a curing promoter or hardener which substantially reduces cure times when the filleting composition is heated As another feature of the present invention, silicon dioxide is used as the viscosity control additive to regulate the extrudability and application characteristics of the filleting material The above-discussed and many other features and attendant advantages of the present invention will become apparent as the invention becomes better understood by reference to the following detailed description.

DESCRIPTION OF THE PREFERRED EMBODIMENTS

The present invention is directed to a filleting composition which is adapted for use as a sealant and/or adhesive in electronic assemblies. Although the filleting composition may be used for other applications, it is designed for use in electronic assemblies where a low dielectric constant is necessary.

The filleting composition in accordance with the present invention is stored as a frozen premix having a diisocyanate component, polyol component, filler/curing promoter additive and a viscosity control additive The frozen premix contains 9 to 11 weight percent of a diisocyanate having the formula OCN—[CH$_2$]n—NCO where n = 1 to 6.

The preferred diisocyanate is hexamethylene diisocyanate where n = 6.

The polyol component is present in an amount of between 38 to 42 weight percent and has the formula

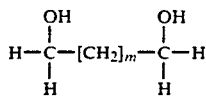

where m = 1 to 10.

The preferred polyol is propylene glycol where m = 1.

The filler/curing promoter additive is present in an amount of 45 to 53 weight percent. The preferred filler/curing promoter additive is boron nitride. Beryllium oxide can also be used as a suitable filler/curing promoter additive; however, the use of beryllium oxide is not preferred due to its high toxicity. The boron nitride functions not only as a filler, but also as a catalyst since the curing mechanism for the present composition is based on the reaction between the diisocyanate and polyol in the presence of the nitrogen-rich boron nitride. In addition, the boron nitride was found to lower the dielectric constant of the filleting material to levels below 4.0 at 1.0 kHz and also to increase the thermal conductivity to around 0.3 British thermal unit per hour-foot-° F. (BTU/HR-FT-° F.).

The viscosity control additive is present in an amount between 0.25 to 1 weight percent. Suitable viscosity control additives include silicon dioxide, asbestos, diatomaceous earth, kaolin and other clay materials. Silicon dioxide is the preferred viscosity control additive since it provides a composition which is easily extrudable from conventional syringe applicators while at the same time being sufficiently viscous to not sag or flow after application to the electronic assembly.

The particle size for the filler/curing promoter additive should be less than about 53 microns. Likewise, the particle sizes for the viscosity control additive should be less than about 53 microns. When boron nitride is used as the filler/curing promoter additive, an average particle size of about 44 microns is preferred. With respect to silicon dioxide, an average particle size of about 44 microns is preferred.

Filleting materials having the above composition are cured at temperatures of between about 190° F. and 210° F. The curing temperature is maintained for around one and a half hours; however, longer cure times are possible, if desired. The pot life for compositions in accordance with the present invention ranges from 2 to 3 hours. This increased working life makes the present compositions especially well suited for use in commercial mass production environments where pot life of various materials used in the process have a direct effect on assembly line efficiency.

In addition, this filleting material meets the National Aeronautics and Space Administration (NASA) outgassing requirements as set forth in the American Society for Testing and Material (ASTM) specification E595, namely that the total mass loss should not exceed one percent by weight and that collectible volatile condensable material (CVCM) be 0.10 weight percent or less.

Examples of practice are as follows:

EXAMPLE 1

A premix was prepared which contained 10 weight percent hexamethylene diisocyanate, 40 weight percent propylene glycol, 49 weight percent boron nitride and 1 weight percent silicon dioxide. The four compounds were uniformly mixed and the resulting mixture was placed into conventional syringes used for filleting polymer adhesives and/or sealants. The syringes were cooled to a temperature of below 32° F. to provide a frozen premix which could be stored indefinitely.

When ready for use, the syringe containing the frozen premix was thawed at room temperature. The thawed polyurethane filleting composition was applied to a number of different substrates including plastics and metals. The composition was cured at a temperature of 200° F. for 1.5 hours. Prior to curing, the various physical properties of the filleting composition were measured and found to be well within acceptable limits for use in electronic assemblies. The physical properties of the composition prepared in accordance with this example are set forth in the following table.

TABLE

| PHYSICAL PROPERTIES | |
|---|---|
| Property Measured | Result |
| Work Life | 3 hours |
| Hardness | 67 Type A |
| Thixotropy | Sagging 0.15 inch |
| Color | Off white |
| Specific Gravity | 1.24 g/cc |
| Thermal Conductivity | 0.32 BTU/hr-ft-°F. |
| Dieletric Constant at 1.0 kHz | 3.59 |
| Dissipation Factor at 1.0 MHz | $1.56 \times 10^{-2}$ |
| Volume Resistivity | $1.08 \times 10^{10}$ ohm cm |
| Dielectric Strength | 829 volts/mil |
| Glass Transition Temp (Tg) | −90° F. |
| Coefficient of Thermal Expansion | |
| Above Tg | $12.4 \times 10^{-5}$ mm/mm °C. |
| Below Tg | $4.5 \times 10^{-5}$ mm/mm °C. |

As is apparent from the above table, the filleting composition in accordance with the present invention provides a useful sealant and/or adhesive which is especially well suited for use in electronic assemblies.

EXAMPLE 2

A filleting composition is prepared according to Example 1 except that propylene diisocyanate is substituted for hexamethylene diisocyanate. The curing temperature and time are the same and the work life will also be around 3 hours. Other properties of this filleting composition based on propylene diisocyanate will be the same as in Example 1 except that hardness will increase. However, flexibility will be reduced and hydrolytic stability will be diminished.

EXAMPLE 3

A filleting composition is prepared according to Example 1 except that hexamethylene glycol is substituted in place of propylene glycol. Again, the curing conditions will be the same as for Examples 1 and 2. Work life of the filleting composition will also be in the 2 to 3 hour range. The properties of this filleting compound will be the same as in Example 1 except that hardness and modulus will increase considerably while the coefficient of thermal expansion will be reduced.

EXAMPLE 4

A filleting composition in accordance with Example 1 is prepared except that hexamethylene glycol is substituted for propylene glycol. The curing conditions for this filleting composition are the same as in the previous examples and the properties of the filleting composition will be the same as in Example 1 except that the composition will be more stable in high humidity and at elevated temperature.

EXAMPLE 5

A composition is prepared in accordance with Example 1 except that diatomaceous earth is substituted for the silicon dioxide. The curing conditions and work life for this filleting composition will be the same as in the previous examples The properties for this composition will also be the same as in Example 1 except that the cure time will be longer and the density will be higher.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. An adhesive composition adapted for use as a filleting material for electronic assemblies, said composition comprising:

(a) 9 to 11 weight percent of a diisocyanate having the formula $$OCN-[CH_2]_n-NCO$$

where n=1 to 6;

(b) 38 to 42 weight percent of a polyol having the formula

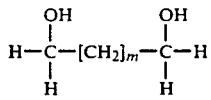

where m=1 to 10;

(c) 45 to 53 weight percent of a filler/curing promoter additive; and (d) 0.25 to 1 weight percent of a viscosity control additive whereby said composition is cured by heat and said cured composition has a dielectric constant of less than 4.0 at 1 kilohertz and effectively seals or adheres one or more components of said electronic assemblies by a filleting procedure.

2. A composition according to claim 1 wherein said filler/curing promoter additive is boron nitride.

3. A composition according to claim 1 wherein said viscosity control additive is selected from the group consisting of silicon dioxide, kaolin, asbestos and diatomaceous earth.

4. A composition according to claim 3 wherein said viscosity control additive is silicon dioxide.

5. A composition according to claim 2 wherein said viscosity control additive is silicon dioxide 6. A composition according to claim 5 comprising about 10 weight percent of said diisocyanate, about 40 weight percent of said polyol, about 49 weight percent boron nitride and about 1 weight percent silicon dioxide.

7. A composition according to claim 6 wherein n=6 and m=1.

8. A composition according to claim 7 wherein the temperature of said composition is sufficiently low to maintain said composition in a frozen state to prevent curing.

9. A composition according to claim 1 wherein the temperature of said composition is sufficiently low to maintain said composition in a frozen state to prevent curing.

* * * * *